(12) United States Patent
Chalupper et al.

(10) Patent No.: US 7,010,133 B2
(45) Date of Patent: Mar. 7, 2006

(54) METHOD FOR AUTOMATIC AMPLIFICATION ADJUSTMENT IN A HEARING AID DEVICE, AS WELL AS A HEARING AID DEVICE

(75) Inventors: Josef Chalupper, Paunzhausen (DE); Patrick Mergell, Summerville Park (SG)

(73) Assignee: Siemens Audiologische Technik GmbH, Erlangen (DE)

( * ) Notice: Subject to any disclaimer, the term of this patent is extended or adjusted under 35 U.S.C. 154(b) by 62 days.

(21) Appl. No.: 10/787,480

(22) Filed: Feb. 26, 2004

(65) Prior Publication Data

US 2004/0190740 A1    Sep. 30, 2004

(30) Foreign Application Priority Data

Feb. 26, 2003   (DE) ................................ 103 08 483

(51) Int. Cl.
*H04R 25/00* (2006.01)
(52) U.S. Cl. ...................... 381/312; 381/94.3; 381/314; 381/321

(58) Field of Classification Search ............... 381/23.1, 381/60, 312, 314, 316, 317, 320, 321, 71.6, 381/94.1, 94.2, 94.3, 94.7, 101, 102; 704/226, 704/233
See application file for complete search history.

(56) References Cited

U.S. PATENT DOCUMENTS

| | | | |
|---|---|---|---|
| 6,198,830 B1 * | 3/2001 | Holube et al. ............... 381/321 |
| 6,236,731 B1 * | 5/2001 | Brennan et al. ............ 381/316 |
| 6,606,391 B1 * | 8/2003 | Brennan et al. ............ 381/316 |

* cited by examiner

*Primary Examiner*—Huyen Le
(74) *Attorney, Agent, or Firm*—Schiff Hardin LLP

(57) ABSTRACT

To improve the speech comprehensibility given treatment with a hearing aid device, during the operation of the hearing aid device speech signal levels and noise signal levels are determined in a plurality of frequency bands of an input signal. An automatic adjustment of the amplification follows, dependent on the determined signal level and the signal frequency. The determination of amplification parameters thereby ensues under inclusion of a loudness model and a speech comprehensibility model.

17 Claims, 1 Drawing Sheet

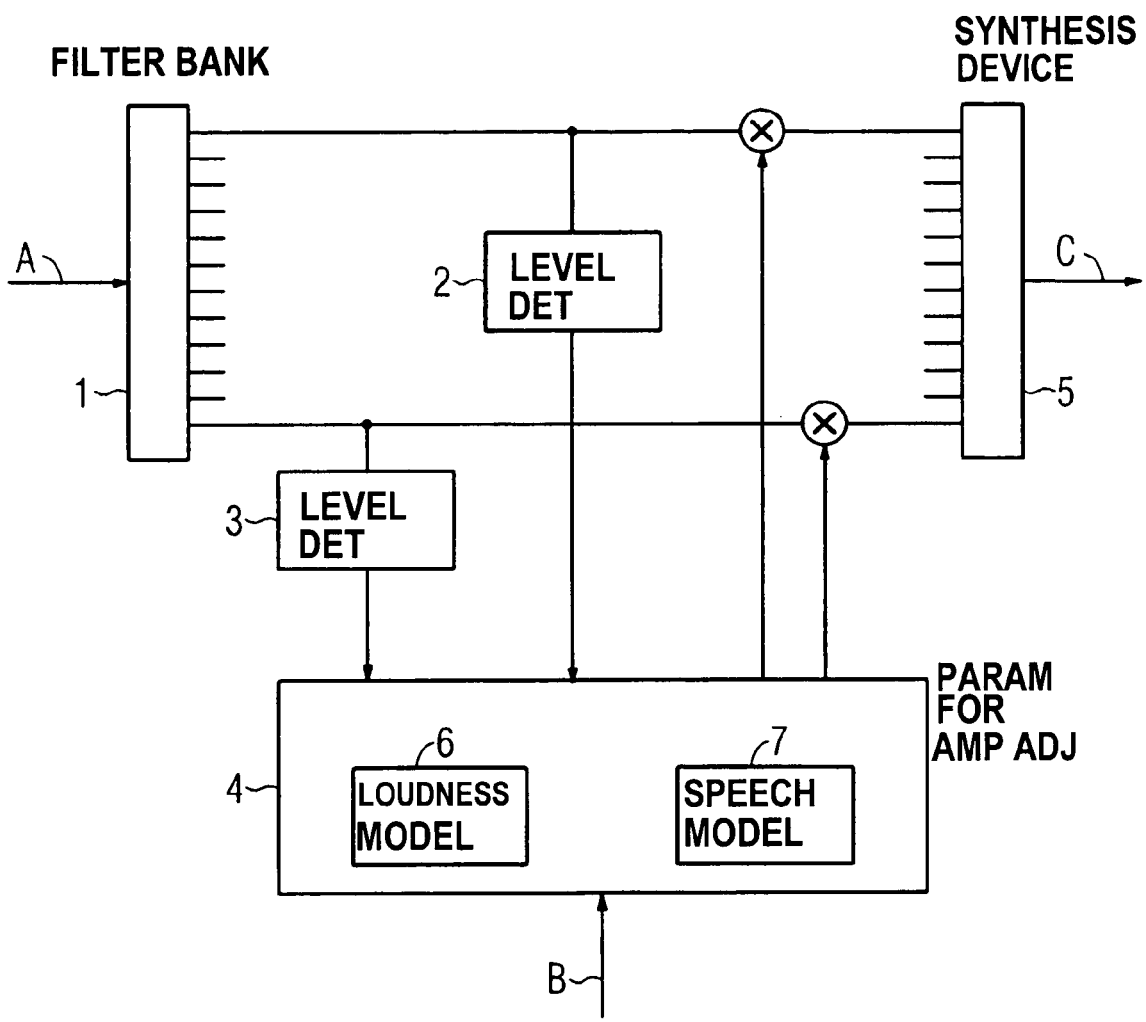
FIG.

METHOD FOR AUTOMATIC AMPLIFICATION ADJUSTMENT IN A HEARING AID DEVICE, AS WELL AS A HEARING AID DEVICE

BACKGROUND OF THE INVENTION

For those hard of hearing, the comprehensibility of speech in an auditory environment with background noises represents a large problem. An optimization of the speech comprehensibility can be achieved via a skilled adjustment of the time- and frequency-dependent amplification of an acoustic input signal by a hearing aid device. The problem is thereby posed to find a rule or, respectively, an algorithm that can determine an optimal time- and frequency-dependent amplification for arbitrary (particularly also time-variant) speech signals/background noise mixes.

Given the use of the hearing aid device, it has so far been attempted to improve the speech comprehensibility via a skilled selection of setting parameters that influence the signal processing in the hearing aid device. For this, different, non-linear adaptation formulas have been used with different objectives. An adaptation formula designated under the designation "DSL i/o" substantially aims to restore the loudness of a person of normal hearing.

In contrast to this, given the adaptation formula known as "NAL-NL1", the goal is pursued to achieve a maximum speech comprehensibility. While the loudness can be restored independent of the type of the noise, the speech comprehensibility depends on the spectral energy distribution of the speech signal relative to the spectral energy distribution of the noise signal. However, in NAL-NL1 this dependency on the background noise spectrum or, respectively, background noise level, remains unaccounted for since this adaptation formula assumes an optimization of the speech comprehensibility in a quiet situation. A further restriction in the cited formulas is that they are based on a static characteristic line, i.e., that the optimal loudness or, respectively, speech comprehensibility can not be achieved at any arbitrary point in time via the corresponding adaptation formula, but rather only in the temporal median.

Given the adaptation formula NAL-NL1, the optimal amplification for a specific hearing loss and a specific input signal is determined in advance ("offline") and not in the hearing aid device. For this, that amplitude leading to an optimized speech comprehensibility is determined for each hearing loss/input level combination for the average speech spectrum with a speech comprehensibility and loudness model adapted to the hearing loss, without exceeding (in the feed of the hearing aid device) the volume that would be experienced in this situation by a person of normal hearing.

It is also known to provide adaptive filters for relief of background noise. Without consideration of the hearing loss, the amplification is calculated based on static assumptions about the speech signal and the noise signal, such that the speech signal is reconstructed from the speech signal/noise signal mix in a static sense, without taking into account perceptive effects in speech comprehensibility. Examples for this procedure are the use of a Vienna filter or spectral subtraction.

SUMMARY OF THE INVENTION

It is the object of the present invention to improve the speech comprehensibility in an environment afflicted with noise signals.

This object is achieved via a method for automatic amplification adjustment in a hearing aid device, with the following steps:

transduction of the acoustic input signal into an electrical signal, determination of a speech signal level and of a noise signal level in a plurality of frequency bands of the electrical signal, determination of parameters for automatic adjustment of the amplification of the electrical signal dependent of the speech signal level, of the noise signal level, and of the frequency of the electrical signal.

Furthermore, the object is achieved via a hearing aid device with a filter bank to split an electrical signal into frequency bands, a device to determine a speech signal level and a noise signal level in the frequency bands, and a device to determine parameters for automatic adjustment of the amplification of the electrical signal dependent on the speech signal level and on the noise signal level.

Embodiments of the invention described below are advantageous because, via a simultaneous optimization of the speech comprehensibility on the one hand and of the loudness on the other hand, the speech comprehensibility is improved based on the current speech spectrum and the background noise spectrum and, at the same time, the loudness effect of a person of normal hearing is determined for the hearing device user. This goal is achieved in that the amplification is not, as before, calculated statically and "offline", but rather is determined and adjusted dynamically (time-variant) in the hearing aid device. The time-dependent actual existing speech signal/noise signal mixes as well as the hearing device signal processing can thereby be considered in the amplification adjustment.

In the automatic adjustment of the amplification, the individual audiometric data of the hearing device user (for example the auditory threshold or the discomfort threshold) may also advantageously be taken into account in the adjustment of the amplification. Thus not only the data of the hearing loss, but rather at the same time properties of the background noise go into the adjustment of the amplification. The effects of the hearing loss on the speech perception may thereby be taken into account. Since the calculation of adjustment parameters is implemented "online" with regard to the amplification, meaning during the normal operation of the hearing aid device under actual present speech and noise signals, effects of the hearing device signal amplification on the speech comprehensibility can be considered. For example, the speech comprehensibility is influenced by the effective compression.

DESCRIPTION OF THE DRAWING

An exemplary embodiment of the invention is shown in the FIGURE, which is an illustrative block diagram of the components.

DETAILED DESCRIPTION OF THE PREFERRED EMBODIMENTS

In an embodiment of the invention, an acoustic input signal A is transduced into an electrical signal by a hearing aid device. The electrical signal A is (as the case may be, after an A/D conversion) first supplied to a filter bank 1. The electrical input signal A is split by this into a plurality of frequency bands. The overall level, the speech signal level and the background noise level are determined from the signals of the individual frequency bands. This level determination can also ensue via level evaluation using known evaluation methods. To improve the clarity, in the exemplary embodiment, units 2 or, respectively, 3 for level determination are only drawn in for two of the frequency bands.

The determined levels are supplied to a device 4 to determine parameters for automatic adjustment of the amplification. In addition to the signal levels, individual audiometric data B of the hearing device user (for example, the auditory threshold or the discomfort threshold) also enter into this. The amplification calculation is based on both a loudness model 6 and a speech comprehensibility model 7. The amplification of the individual channels is advantageously established for each time segment with a mathematical optimization method such that the speech comprehensibility is optimized, whereby the loudness effect that a person of normal hearing has given the same acoustic input signal is at least substantially maintained.

For this, in the individual frequency bands, the electrical signals are respectively multiplied by a factor determined in the device 4, such that frequency bands important for the speech comprehensibility are emphasized, and frequency bands less important relative to these are amplified correspondingly less or even lowered. The signals of the individual frequency bands are subsequently merged back into an electrical output signal C in a synthesis unit 5 and, if necessary, further processed.

In contrast to the shown exemplary embodiment, other characteristic values of the sound field energy can also be drawn upon in place of the signal level.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Similarly, where the elements of the present invention are implemented using software programming or software elements the invention may be implemented with any programming or scripting language such as C, C++, Java, assembler, or the like, with the various algorithms being implemented with any combination of data structures, objects, processes, routines or other programming elements. Furthermore, the present invention could employ any number of conventional techniques for electronics configuration, signal processing and/or control, data processing and the like.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

REFERENCE LIST

A,B signals
C audiometric data
1 filter bank
2,3 units for level determination
4 device to determine parameters for automatic adjustment of the amplification
5 synthesis device
6 loudness model
7 speech comprehensibility model

What is claimed is:

1. A method for automatic amplification adjustment in a hearing aid device, comprising:
   transducing an acoustic input signal into an electrical signal;
   determining a speech signal level and a noise signal level in a plurality of frequency bands of the electrical signal; and
   determining parameters for automatic adjustment of an amplification of the electrical signal depending on the speech signal level, the noise signal level, and frequency of the electrical signal dynamically, wherein determining parameters comprises applying a loudness model.

2. The method according to claim 1, further comprising:
   determining an overall signal level of the electrical signal in the individual frequency bands and a total signal level of the electrical signal over the entire bandwidth of the electrical input signal;
   wherein
   determining parameters further includes considering the total signal level when performing the automatic adjustment of the amplification.

3. The method according to claim 1, wherein the determining of the speech and noise signal levels includes performing a level evaluation.

4. The method according to claim 1, wherein the determining of the parameters further includes utilizing individual audiometric data of a hearing aid user.

5. The method according to claim 1, wherein determining parameters comprises applying a speech comprehensibility model.

6. A hearing aid device, comprising:
   a filter bank comprising an electrical signal input configured to split an electrical signal into frequency bands, the filter bank comprising an output for a signal in each frequency band;
   one or more level detecting devices comprising an input that is connected to the filter bank output, and an output, the level detecting devices being configured to determine a speech signal level and a noise signal level in the frequency bands; and
   a parameter determining device comprising an input connected to the output of the level detecting devices, the parameter determining device being configured to determine parameters to automatically adjust an amplification of the electrical signal dependent on the speech signal level and the noise signal level dynamically, wherein the parameter determining device further comprises a loudness model that is configured to assist in the parameter determination.

7. The hearing aid device according to claim 6, further comprising a synthesis device having one or more inputs that is connected respectively to one or more outputs of the parameter determining device, the synthesis device further comprising an output for providing an electrical output signal based on one or more frequency bands.

8. The device according to claim 7, further comprising one or more multipliers located between the one or more inputs of the synthesis device and the one or more outputs of the parameter determining device.

9. The hearing aid device according to claim 6, wherein the parameter determining device further comprises a speech comprehensibility model that is configured to assist in the parameter determination.

10. The hearing aid device according to claim 9, wherein the parameter determining device further comprises an individual audiometric data input via which audiometric data are supplied to the parameter determining device.

11. A method for automatic amplification adjustment in a hearing aid device, comprising:
   transducing an acoustic input signal into an electrical signal;
   determining a speech signal level and a noise signal level in a plurality of frequency bands of the electrical signal, and;
   determining parameters for automatic adjustment of an amplification of the electrical signal depending on the speech signal level, the noise signal level, and frequency of the electrical signal dynamically, wherein determining parameters comprises applying a speech comprehensibility model.

12. The method according to claim 11, further comprising:
   determining an overall signal level of the electrical signal in the individual frequency bands and a total signal level of the electrical signal over the entire bandwidth of the electrical input signal;
   wherein
   determining parameters further includes considering the total signal level when performing the automatic adjustment of the amplification.

13. The method according to claim 11, wherein the determining of the speech and noise signal levels includes performing a level evaluation.

14. The method according to claim 11, wherein the determining of the parameters further includes utilizing individual audiometric data of a hearing aid user.

15. A hearing aid device, comprising:
   a filter bank comprising an electrical signal input configured to split an electrical signal into frequency bands, the filter bank comprising an output for a signal in each frequency band;
   one or more level detecting devices comprising an input that is connected to the filter bank output, and an output, the level detecting devices being configured to determine a speech signal level and a noise signal level in the frequency bands; and
   a parameter determining device comprising an input connected to the output of the level detecting devices, the parameter determining device being configured to determine parameters to automatically adjust an amplification of the electrical signal dependent on the speech signal level and the noise signal level dynamically, wherein the parameter determining device further comprises a speech comprehensibility model that is configured to assist in the parameter determination.

16. The hearing aid device according to claim 15, further comprising a synthesis device having one or more inputs that is connected respectively to one or more outputs of the parameter determining device, the synthesis device further comprising an output for providing an electrical output signal based on one or more frequency bands.

17. The device according to claim 16, further comprising one or more multipliers located between the one or more inputs of the synthesis device and the one or more outputs of the parameter determining device.

* * * * *